United States Patent
Uzunov et al.

(10) Patent No.: US 7,808,310 B2
(45) Date of Patent: Oct. 5, 2010

(54) DIFFERENTIAL BAND-PASS FILTER HAVING SYMMETRICALLY INTERWOVEN INDUCTORS

(75) Inventors: Ivan Uzunov, Tampere (FI); Jani Järvenhaara, Tampere (FI); Svetozar Broussev, Tampere (FI); Joni Järvi, Turku (FI); Lars Persson, Grafing (DE)

(73) Assignee: Infineon Technologies, AG, Neubiberg (DE)

( * ) Notice: Subject to any disclaimer, the term of this patent is extended or adjusted under 35 U.S.C. 154(b) by 127 days.

(21) Appl. No.: 11/946,613

(22) Filed: Nov. 28, 2007

(65) Prior Publication Data

US 2009/0134954 A1    May 28, 2009

(51) Int. Cl.
  *H03B 1/00* (2006.01)
  *H03K 5/00* (2006.01)
  *H04B 1/10* (2006.01)
(52) U.S. Cl. .................. 327/557; 333/168; 333/174; 333/175; 333/177
(58) Field of Classification Search .......... 327/557; 333/168, 175, 177, 174
See application file for complete search history.

(56) References Cited

U.S. PATENT DOCUMENTS

| | | | |
|---|---|---|---|
| 4,761,623 A | * | 8/1988 | Schneider .............. 333/167 |
| 5,656,849 A | | 8/1997 | Burghartz et al. |
| 7,095,307 B1 | * | 8/2006 | Barrett et al. .............. 336/200 |
| 7,468,642 B2 | * | 12/2008 | Bavisi et al. ............... 333/168 |
| 2003/0006860 A1 | * | 1/2003 | Chueh et al. ............... 333/175 |
| 2003/0137607 A1 | | 7/2003 | Kovacic et al. |
| 2005/0077992 A1 | * | 4/2005 | Raghavan et al. .......... 336/200 |
| 2006/0256242 A1 | | 11/2006 | Birleson et al. |

OTHER PUBLICATIONS

"Filter Design Using Transformed Variables", H.J. Orchard and Gabor C. Temes, IEEE Transactions on Circuit Theory, vol. CT-15, No. 4, Dec. 1968, pp. 385-408.

* cited by examiner

*Primary Examiner*—Lincoln Donovan
*Assistant Examiner*—John W Poos
(74) *Attorney, Agent, or Firm*—Eschweiler & Associates, LLC

(57) ABSTRACT

One embodiment of the invention relates to a dynamically adjustable differential band-pass filter. This band-pass filter includes a first leg that has an input portion and an output portion with a first inductor therebetween. It also includes a second leg in parallel with the first leg, where the second leg has an input portion and an output portion with a second inductor therebetween. The first inductor is symmetrically inter-woven with the second inductor. In some embodiments, the band pass filter is configured to compensate for losses due to the inductors. Other band-pass filters and methods are also disclosed.

17 Claims, 10 Drawing Sheets

DIFFERENTIAL BAND-PASS FILTER HAVING SYMMETRICALLY INTERWOVEN INDUCTORS

FIELD OF INVENTION

The present invention relates generally to electronic filters, and more specifically to band-pass filters.

BACKGROUND OF THE INVENTION

Tuners are used in a variety of consumer and commercial systems such as radios, TVs, VCRs, and more sophisticated devices that include cable modems and cable set-top-boxes. In essence, tuners can receive a wide range of available channels and select a particular channel or sub-channel therefrom. A band-pass filter is one component that helps to facilitate this functionality.

In a cable television system, for example, a cable provider transmits multiple television channels over a wide frequency spectrum. Each channel is assigned a unique frequency band, thereby minimizing interference between adjacent channels. FIG. 1, for example, shows a frequency allocation chart 100 that shows a frequency range in the electromagnetic spectrum associated with cable television channels in the United States. As shown, groups of television channels are associated with various frequency ranges (e.g., channels 2-6 are associated with the low VHF range at 54-88 MHZ), where each television channel is transmitted over a distinct 6 MHz frequency band. For example, Channel 2 corresponds to a frequency range of 54 MHz to 60 MHz, Channel 3 corresponds to a frequency rand of 60-66 MHz, and so on. Each television channel often has sub-channels, such as a video or picture sub-channel and an audio or sound sub-channel.

In order to select a particular channel or sub-channel from the frequency spectrum, tuners typically include a passband filter that allows only a limited frequency range to pass. FIG. 2 shows an ideal transmission characteristic 200 for an ideal band-pass filter that includes: a lower stopband 202 where the transmission (|T|) is zero, a passband 204 where the transmission is unity, and an upper stopband 206 where the transmission is zero. Thus, the ideal band-pass filter allows frequencies in the passband to pass, but blocks frequencies that fall within the stopbands. By "sliding" the frequency range of the passband to a higher or lower frequency and adjusting the width of the passband, the band-pass filter could be tuned, for example, to a particular 6 MHz channel or to an even narrower sub-channel within a given 6 MHz channel. This would allow a viewer to see the content on the selected channel without interference from adjacent channels. Similar functionality could be used for radio channels or other portions of the electromagnetic spectrum. Note that even though FIG. 2's idealized characteristics are helpful in understanding the functionality of a band-pass filter, practical circuits cannot realize these idealized characteristics.

Although existing band-pass filters are sufficient for their stated purpose, improvements in this technology are constantly ongoing.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment of the invention relates to a dynamically adjustable differential band-pass filter. The band-pass filter includes a first leg that has an input portion and an output portion with a first inductor therebetween. It also includes a second leg in parallel with the first leg, where the second leg has an input portion and an output portion with a second inductor therebetween. The first inductor is symmetrically inter-woven with the second inductor.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
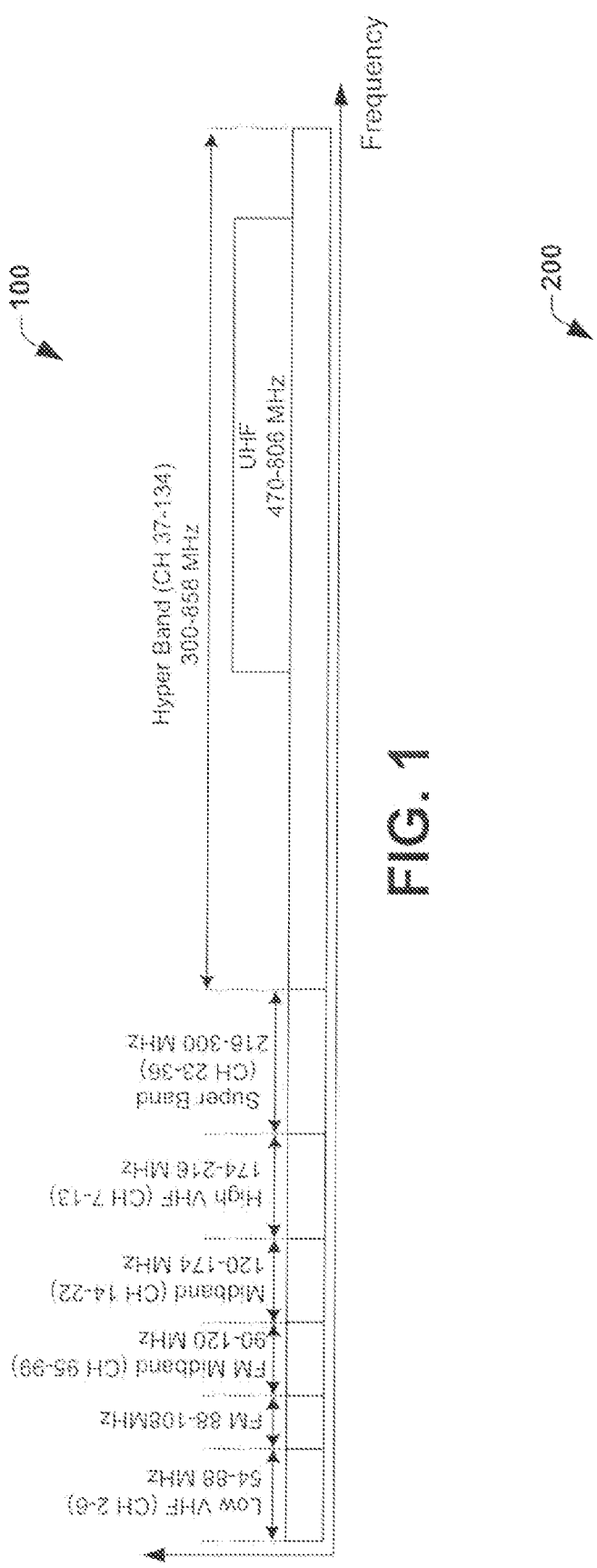
FIG. 1 is a frequency allocation chart that shows a portion of the electromagnetic spectrum assigned to cable television in the United States.
Figure 2:
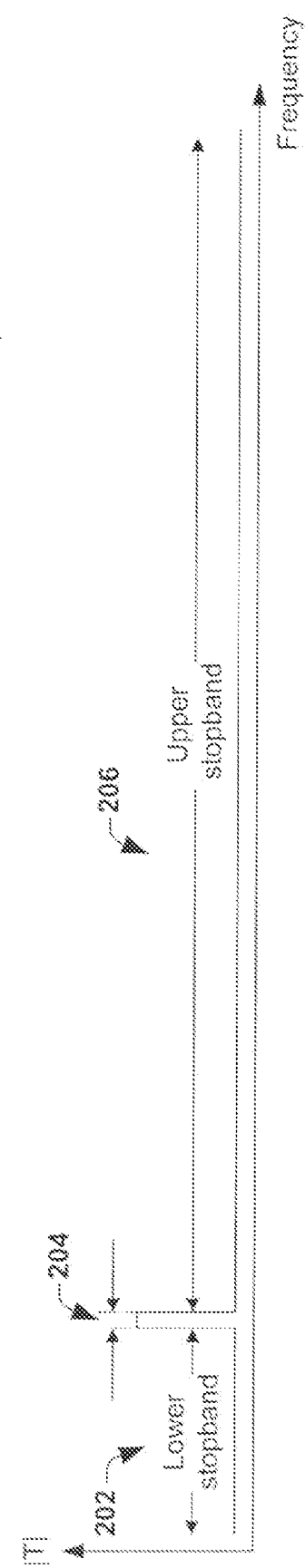
FIG. 2 shows an ideal transmission characteristic 200 for a band-pass filter.

One or more implementations of the present invention will now be described with reference to the attached drawings, wherein like reference numerals are used to refer to like elements throughout. Although some aspects may be discussed below in the context of a TV tuner, the invention is applicable to other technologies where filtering may be employed.

Figure 3:
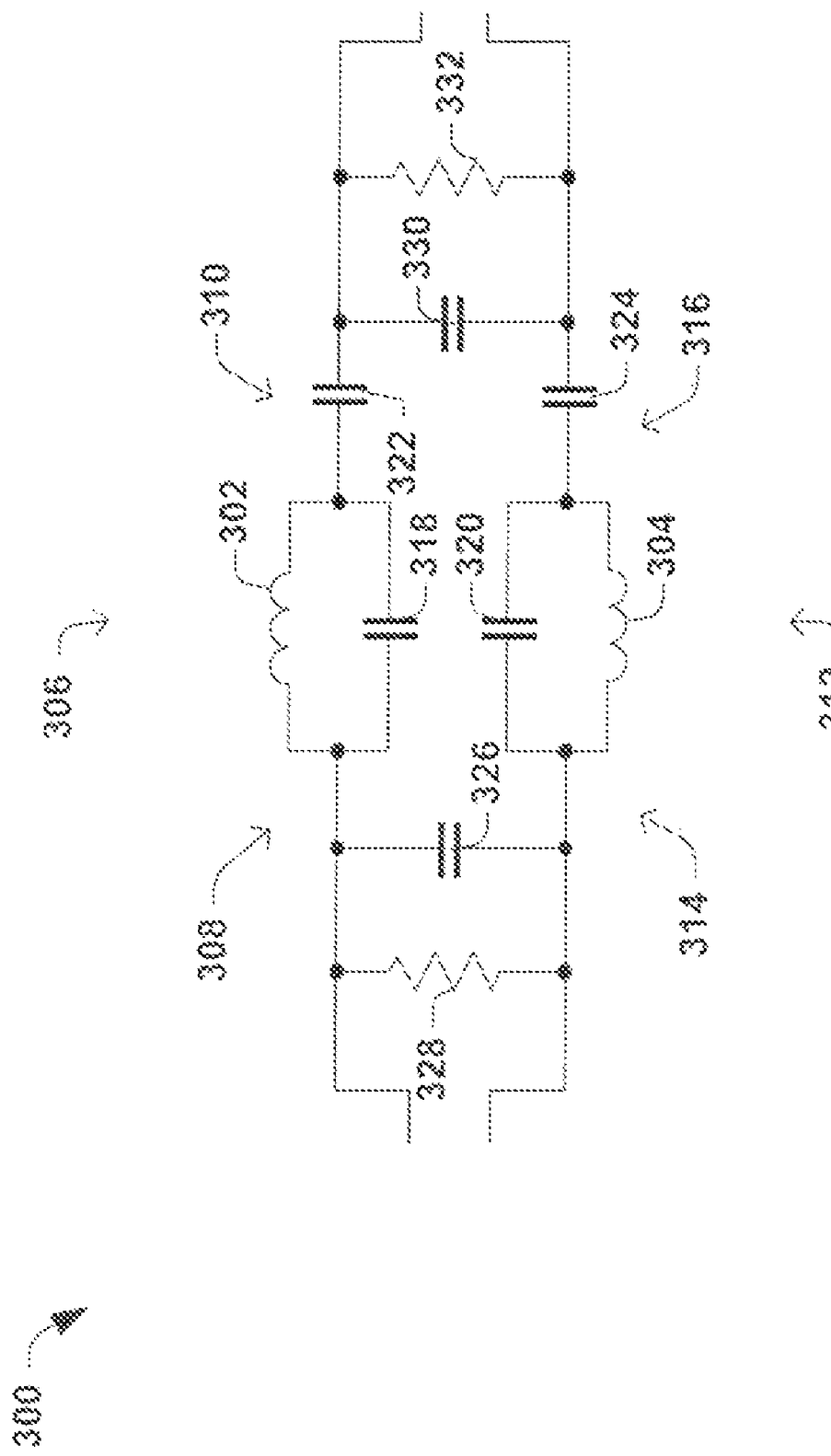
FIG. 3 is a schematic of one embodiment of an adjustable differential band-pass filter.

Referring now to FIG. 3, one can see one embodiment of an adjustable differential band-pass filter 300 that may be used in a tuner, such as a TV tuner, radio tuner, etc. This adjustable differential band-pass filter 300 could be tuned to a particular channel within a frequency spectrum of interest as discussed above.

The adjustable differential band-pass filter 300 includes two inductors: a first inductor 302 and a second inductor 304.

The first inductor 302 is associated with a first leg 306 of the band-pass filter 300, which first leg 306 has input and output portions, 308, 310 respectively. Similarly, the second inductor 304 is associated with a second leg 312 of the band-pass filter 300, which second leg 312 has input and output portions, 314, 316, respectively. The differential band-pass filter 300 also includes a first capacitor 318 in parallel with the first inductor 302; a second capacitor 320 in parallel with the second inductor 304; a third capacitor 322 along the output portion 310 of the first leg 306; and a fourth capacitor 324 along the output portion 316 of the second leg 312. The input portions 308, 314 of the first and second legs are coupled to one another by a fifth capacitor 326 and first resistor 328; while the output portions 310, 316 of the first and second legs are coupled by a sixth capacitor 330 and second resistor 332.

This adjustable differential band-pass filter 300 is advantageous in that it can be tuned to pass a frequency range associated with a given channel while at the same time suppressing an image frequency equal to:

$$f_{image} = f_{channel} + 2f_{LO}$$

where $f_{image}$ is the image frequency; $f_{channel}$ is a central frequency of the selected channel, and $f_{LO}$ is a local oscillator frequency. Typically for TV channels with central frequencies above 400-500 MHz, the image frequency is at a distance, which is less than 25% from the central frequency of the selected channel.

In embodiments where the differential band-pass filter 300 is made of several discrete components, the first and second resistors 328, 332 generally have fixed resistances, while the first and second inductors 302, 304 and various capacitors (318, 320, 322, 324, 326, 330) are adjustable. To tune the adjustable differential band-pass filter 300, one could vary the inductances in conjunction with the capacitances to achieve the desired functionality. Although it would be advantageous to tune the filter 300 over a wide frequency range, however, discrete inductors 302, 304 are typically adjustable over only a narrow frequency range. Thus, when the filter 300 includes discrete inductors it will often have a limited frequency range, which is less than ideal.

Further, until now, there are several considerations that have made it extremely difficult to form this filter 300 in a limited number of integrated circuits (e.g., a single integrated circuit). For example, until now, inductors, such as the first and second inductors 302, 304, would have been formed in separate and distinct regions on an integrated circuit. For example, the first inductor 302 could have been formed in an upper-right hand quadrant of the integrated circuit, and the second inductor 304 could have been formed in a lower left-hand quadrant of the integrated circuit. In terms of area, each independent inductor would be relatively large, making integration difficult. In addition, because the inductors 302, 304 would be formed in separate and distinct regions of the integrated circuit, the matching between the inductors may be less than ideal. Therefore, due to the large area consumed by two such inductors and possibility of imprecise matching, it would have previously been difficult to implement the adjustable differential band-pass filter 300 in an integrated circuit in a cost-effective manner.

Figure 4A:
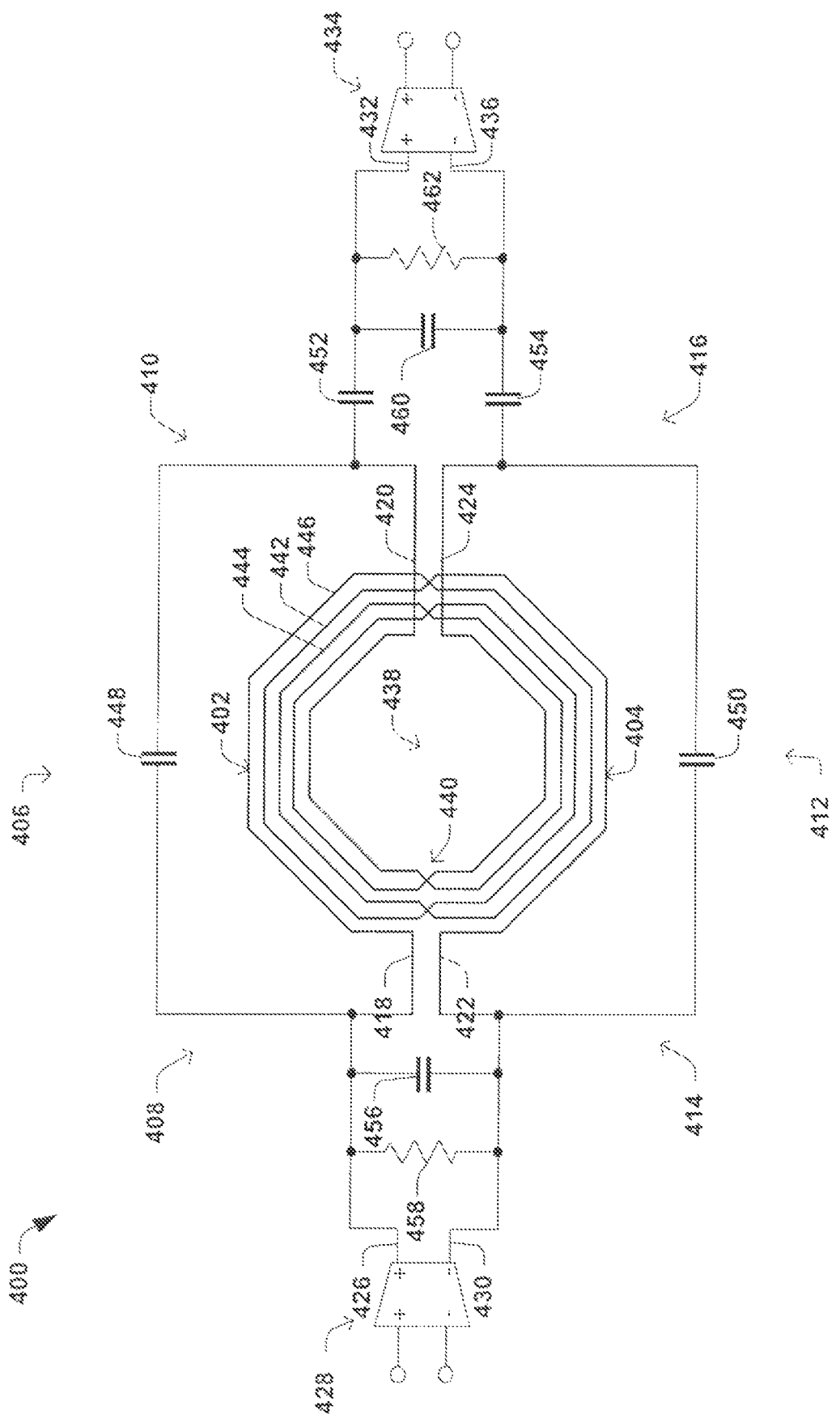
FIG. 4A-4B are schematics of embodiments of an adjustable differential band-pass filter with symmetrically interwoven first and second inductors.

Accordingly, in some aspects of the invention, the inventors have fashioned an adjustable differential band-pass filter that is adjustable over a wide-frequency range and which is formed in a single integrated circuit (or a limited number of integrated circuits). FIG. 4A shows one such adjustable differential band-pass filter 400. To facilitate the integration, the adjustable differential band-pass filter 400 includes a first inductor 402 and a second inductor 404 that are symmetrically interwoven with one another, thereby reducing the required area of the filter and providing more precise matching than previously available.

Like previous filter 300, the adjustable differential band-pass filter 400 includes a first leg 406 having input and output portions 408, 410, respectively; as well as a second leg 412 having input and output portions 414, 416, respectively. The first inductor 402 has a first terminal 418 that is coupled to the input portion 408 of the first leg 406 and a second terminal 420 that is coupled to the output portion 410 of the first leg 406. Similarly, the second inductor 404 has a first terminal 422 that is coupled to the input portion 414 of the second leg 412 and a second terminal 424 that is coupled to the output portion 416 of the second leg 412. Thus, the input portions 408, 414 and output portions 410, 416 are not limited to a single point, but rather could include any number of points associated with an input terminal or output terminal of the inductors.

Unlike previous filter 300, however, the input portion 408 of the first leg 406 could be coupled to a first differential output 426 of a first differential amplifier 428, and the input portion 414 of the second leg 412 could be coupled to a second differential output 430 of the first differential amplifier 428. Further, the output portion 410 of the first leg 406 could be coupled to a first differential input 432 of a second differential amplifier 434, and an output portion 416 of the second leg 412 could be coupled to a second differential input 436 of the second differential amplifier 434. The first differential amplifier 428 must have high output impedance and usually it is an operational transconductance amplifier. The second differential amplifier 434 could manifest itself in many forms, but its purpose is to buffer the filtered output from the actual load, which is the input impedance in the next stage. In some embodiments, the second differential amplifier 434 could be an operational transconductance amplifier.

The first and second inductors 402, 404 are spiral inductors that are symmetrically interwoven. Each inductor comprises concentric windings made of a conductive material, which concentric windings are disposed about a central region 438 and spiral inwardly or outwardly relative to the central region 438. One will notice that the first and second inductors 402, 404 are substantially mirror-images of one another, being flipped about a central axis. The inductors cross-over one another in symmetric fashion at several diametrically opposed points (e.g., point 440), where the inductors are separated from one another by a dielectric. Thus, although the first inductor 402 and second inductor 404 could be formed in two-levels in the same region of the integrated circuit, they are not shorted together. Further, one will note that winding segments of one of the inductors (e.g, winding segment 442) symmetrically run between two concentrically adjacent winding segments of the other inductor (e.g., winding segment 444 and winding segment 446). Thus, in some respects the first and second inductors 402, 404 act as a single inductor because there is magnetic coupling between the interwoven windings. Because the inductors are symmetrically interwoven, they can be structured to have equal inductances, which eliminates signal degradation due to inductor asymmetry.

Although the illustrated first and second inductors 402, 404 are shown in an octagonal form, the invention is also equally applicable to other symmetrically interwoven inductors. For example, the first and second inductors 402, 404 could also have a circular form, a square form, or any N-sided polygon form (where N is an integer). For purposes of clarity and brevity, only two-and-a-half windings are shown for each inductor. However, any other number of windings may be used to form the windings in accordance with the desired characteristics of the first and second inductors. In addition, although the first and second inductors 402, 404 are shown and discussed as being formed within two levels that are separated from one another by a dielectric, additional levels could also be employed. If used, these additional levels could often provide for a further reduction in area.

Similar to FIG. 3's embodiment, one can see FIG. 4A's adjustable differential band-pass filter 400 also includes a first capacitor 448 in parallel with the first inductor 402; a second capacitor 450 in parallel with the second inductor 404; a third capacitor 452 along the output portion 410 of the first leg 406; and a fourth capacitor 454 along the output portion 416 of the second leg 412. The input portions 408, 414 of the first and second legs are coupled to one another by a fifth capacitor 456 and first resistor 458; while the output portions 410, 416 of the first and second legs are coupled by a sixth capacitor 460 and second resistor 462.

Because the first and second inductors 402, 404 are formed in a single integrated circuit, the inductance value of the first and second inductors is typically fixed. Therefore, to tune this adjustable differential band-pass filter 400, the capacitors (448, 450, 452, 454, 456, 460) and resistors (458, 462) are often adjustable. Although the capacitors and resistors are adjustable, to keep full symmetry for the filter typically capacitors 448 and 450 have equal capacitances; capacitors 452 and 454 also have equal capacitances (which could differ from the capacitance of capacitors 448, 450); and resistors 458, 462 have matched resistances. Thus, when the capacitance of 448 or 452 is changed, the capacitance of 450 or 454, respectively, will be changed substantially simultaneously to keep the symmetry for the filter. Similarly, when the resistance of resistor 458 is changed, the resistance of resistor 462 will be changed substantially simultaneously.

To achieve adjustability, each of the capacitors (448, 450, 452, 454, 456, 460) could be implemented as a bank of capacitors, where control switches selectively couple and decouple capacitors within a given bank to adjust the capacitance of the capacitor. Thus, the greater the number of capacitors coupled together, the greater the effective capacitance of the capacitor. The resistors 458, 462 could also be arranged as lines (or other shapes) of resistive material associated with control switches that selectively couple and decouple the lines to adjust the resistance of the resistors. As more lines are coupled together, the resistance for the resistor tends to increase.

Figure 4B:
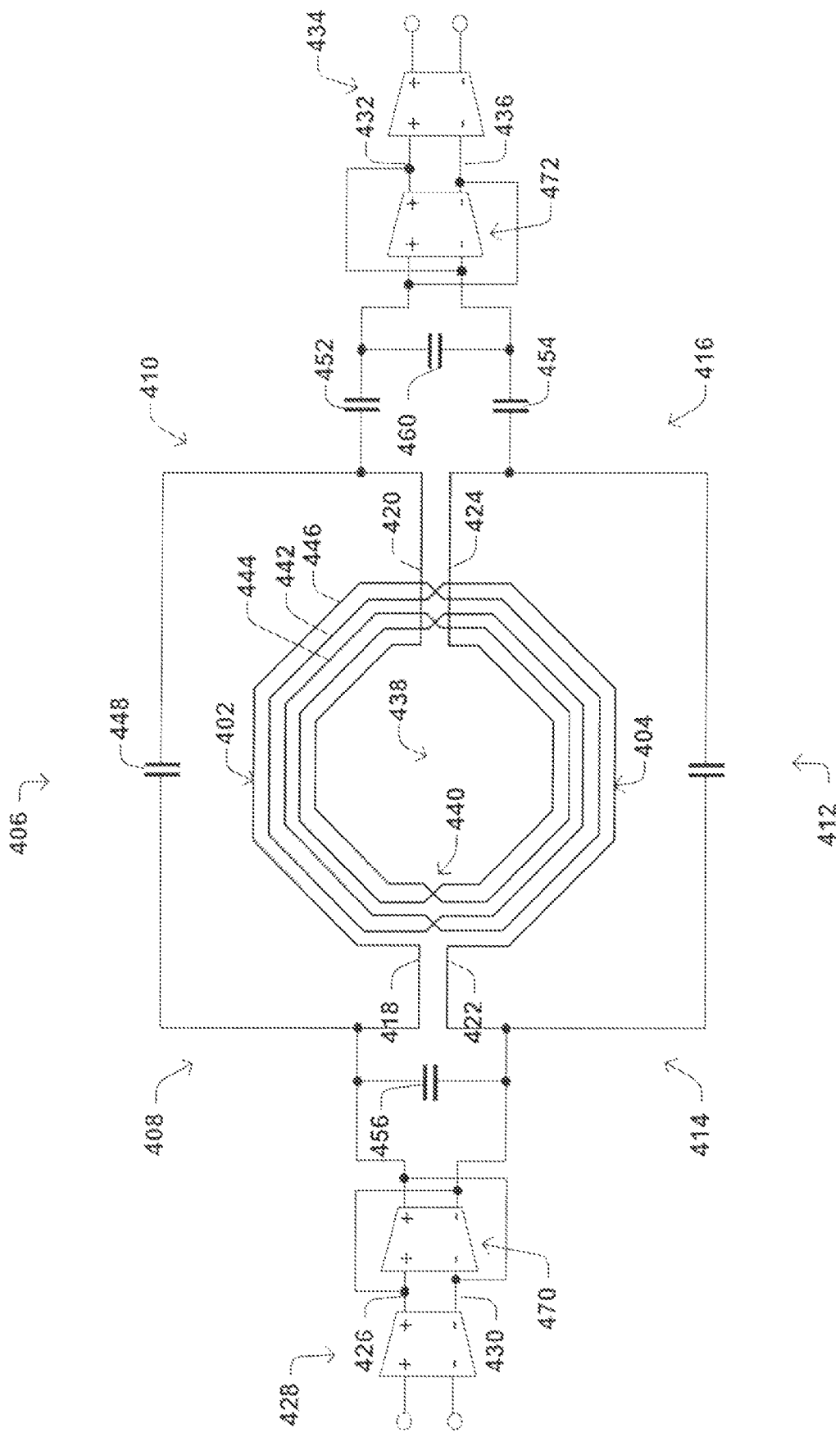

Resistors 458 and 462 could be arranged as operational transconductance amplifiers 470, 472, respectively, in which non-inverting outputs are connected to the inverting inputs and the inverting outputs are connected to the non-inverting inputs according to FIG. 4B. The input impedance of these operational transconductance amplifiers 470, 472 is equal to the reciprical value of their transconductances. The resistances can be tuned by varying of some of DC voltages or currents in the corresponding operational transconductance amplifiers 470, 472. In typical embodiments, the operational transconductance amplifiers 470, 472 consume less area on an integrated circuit than some other types of resistors (e.g., polysilicon lines).

Figure 5:
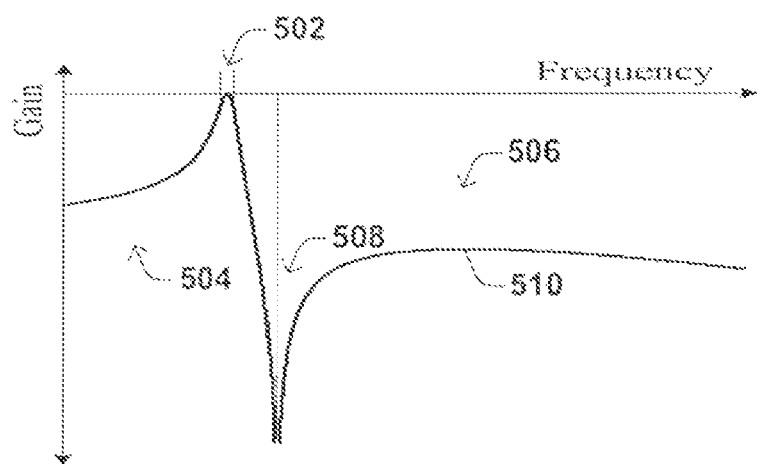
FIG. 5 is chart illustrating a frequency response of one embodiment of an adjustable differential band-pass filter.
Figure 6:
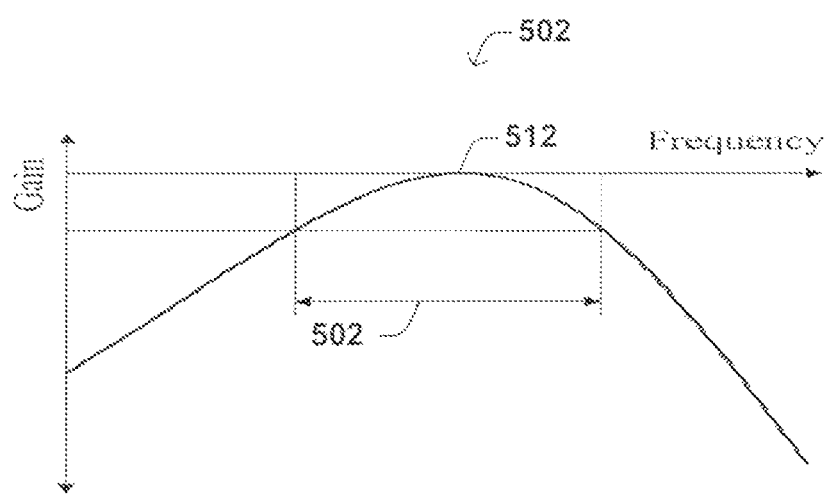
FIG. 6 is a chart that shows an enlarged view of the passband region of FIG. 5.
Figure 7:
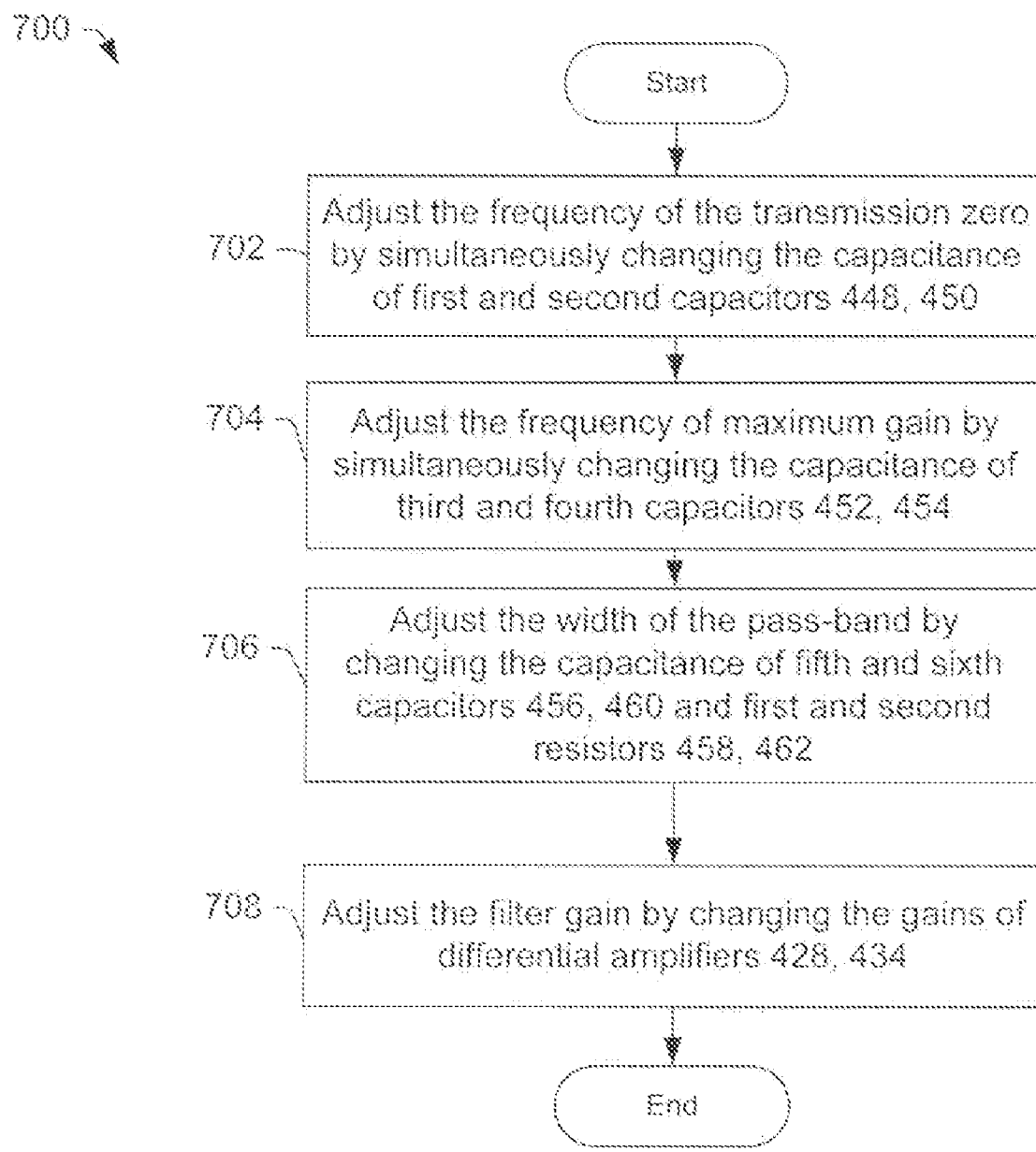
FIG. 7 shows a flowchart illustrating one method for tuning an adjustable differential band-pass filter discussed in the context of FIG. 4A.

A more detailed explanation of one method for tuning the adjustable differential band-pass filter by adjusting the capacitances and resistances will be discussed further herein with reference to FIG. 7. To provide some context for the tuning procedure, FIG. 5-6 show the frequency response 500 of the adjustable differential band-pass filter 400. Notably, the band-pass filter 400 has a passband 502 situated between a lower stop-band 504 and an upper stop-band 506. A transmission zero 508 is located in the upper stop-band, as is a second maximum 510 in the stop-band. FIG. 6 shows a enlarged view of the passband region that highlights a frequency at which the maximum gain occurs 512. In various embodiments, the width of the passband 502 varies from approximately 6 MHz to approximately 12 MHz. Further, in various embodiments, the passband 502 could be centered about frequencies ranging from about 500 MHz to about 900 MHz.

In order to adjust the filter frequency response characteristics, the inventors have also discerned methods for operating an adjustable differential band-pass circuit. Referring now to FIG. 7, one can see a method 700 of tuning discussed in the context of FIG. 4A's a differential band-pass filter 400. Due to the structure of the adjustable differential band-pass filter 400, it will be appreciated that the filter characteristics are often independently tunable (or nearly independently tunable). Therefore, although methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein (e.g., adjustable differential band-pass filter 400), as well as in association with other structures not illustrated.

Method 700 starts at block 702 when the frequency of the transmission zero 508 is adjusted. More specifically, in the context of FIG. 4A's adjustable differential band-pass filter, this could be achieved by simultaneously changing the capacitance of the first and second capacitors 448, 450.

In block 704, the frequency at which the maximum gain occurs 512 is adjusted by simultaneously changing the capacitance of the third and fourth capacitors 452, 454.

In block 706, the width of the passband 502 is adjusted by simultaneously adjusting the capacitance of the fifth and sixth capacitors 456, 460 in conjunction with the first and second resistors 458, 462.

In block 708, the gain is adjusted by simultaneously changing the gains of the first and second differential amplifiers 428 and 434.

Figure 8:
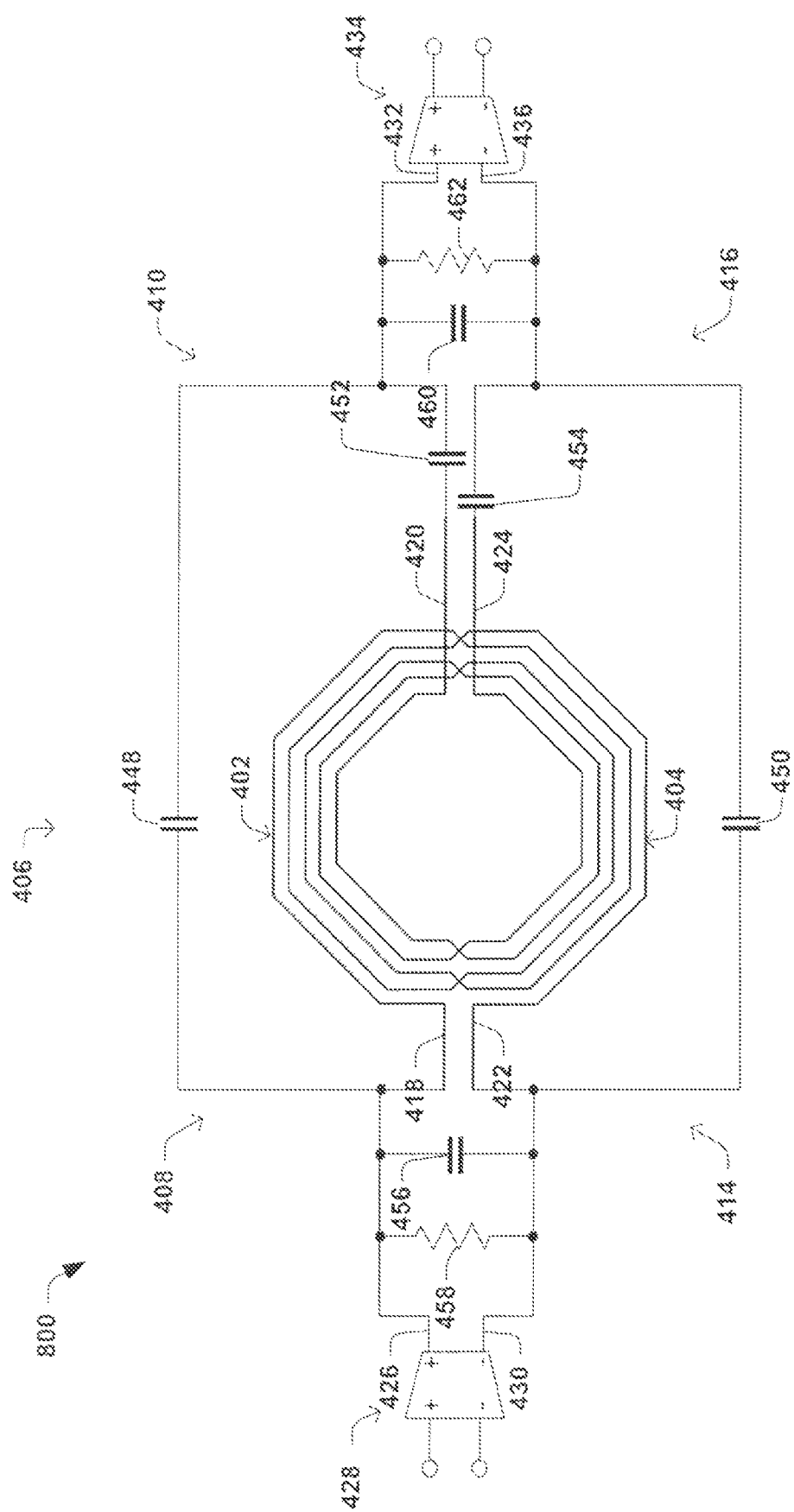
FIG. 8 is a schematic of another embodiment of an adjustable differential band-pass filter.

Referring now to FIG. 8, one can see another embodiment of an adjustable differential band-pass filter 800. This differential band-pass filter 800 largely equivalent to previously discussed differential band-pass filter 400 (see FIG. 4A), except that the LC circuits in both legs are transformed. These LC circuits in the previous filter 400 included parallel LC circuits consisting of first and second inductors 402 and 404 and first and second capacitor 448 and 450. The parallel resonance circuits were connected in series with third and second capacitor 452 and 454. In the new embodiment 800 the first and second inductor 402 and 404 are connected in series with the third and fourth capacitors 452 and 454 forming series resonance LC circuits. These series resonance circuits are connected in parallel to first and second capacitor 448 and 450. The primary difference between the two embodiments is in the values of the components. Assuming the first and second resistors 458, 462 and the frequency of operation are the same, FIG. 8's embodiment requires higher inductances for the first and second inductors 402, 404 and lower capacitances for the capacitors 448, 450, 452, 454 relative to FIG. 4A.

Figure 9:
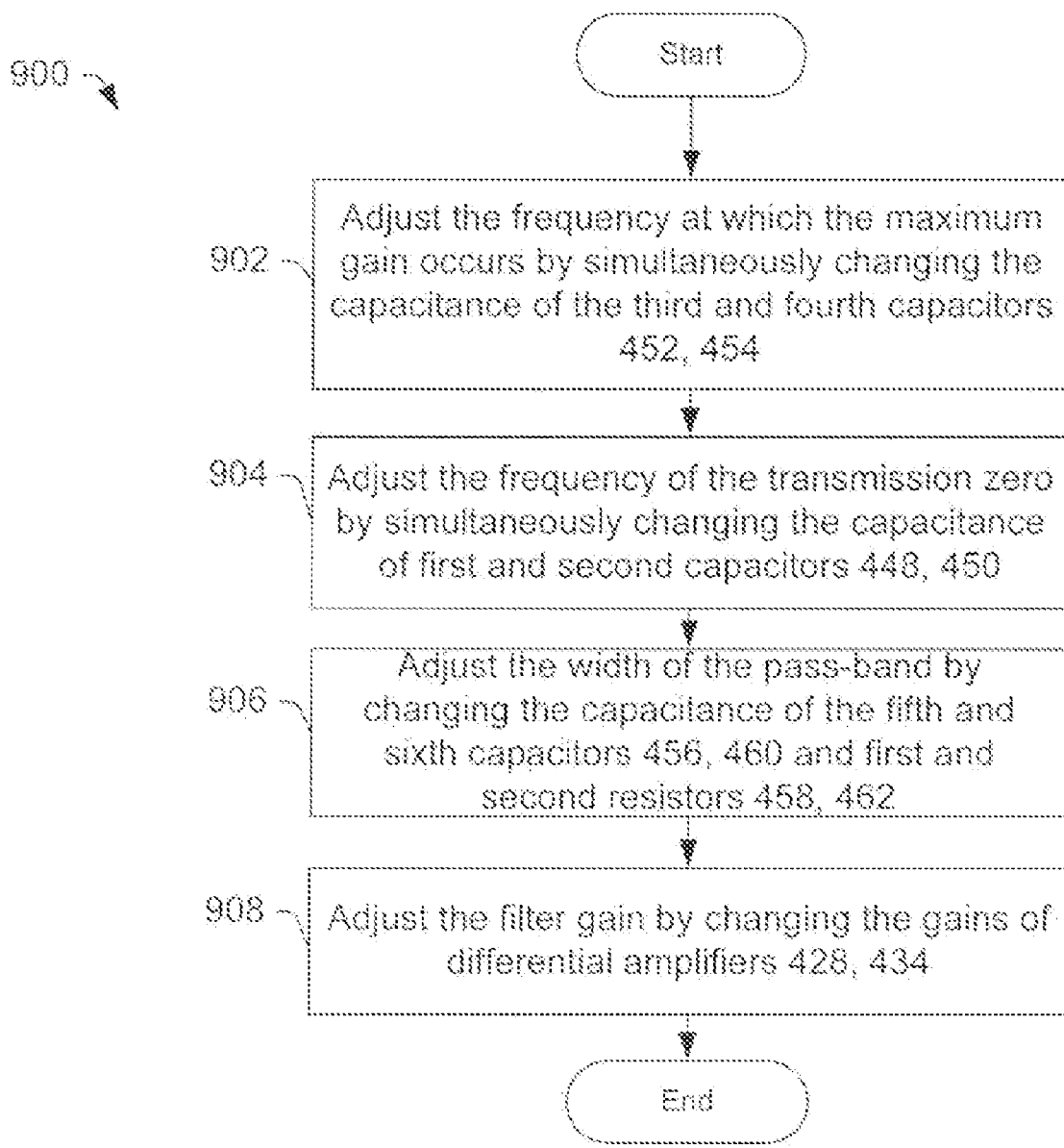
FIG. 9 shows a flowchart illustrating one method for tuning an adjustable differential band-pass filter discussed in the context of FIG. 8.

Also, the tuning procedure for the circuit in FIG. 8 is slightly different than the previous methodology 700 described with respect to FIG. 4A's embodiment. FIG. 9 shows a method 900 for tuning the circuit of FIG. 8. Method 900 starts at block 902 when, the frequency at which the maximum gain occurs is adjusted by simultaneously changing the capacitance of the third and fourth capacitors 452, 454.

In block 904, the frequency of the transmission zero is adjusted by simultaneously changing the capacitance of the first and second capacitors 448, 450.

In block 906, the passband bandwidth is adjusted by simultaneously adjusting the capacitance of the fifth and sixth capacitors 456, 460 and the first and second resistors 458, 462.

In block 908, the gain of the filter is adjusted by simultaneously changing the gains of the first and second differential amplifiers 428 and 434.

Figure 10:
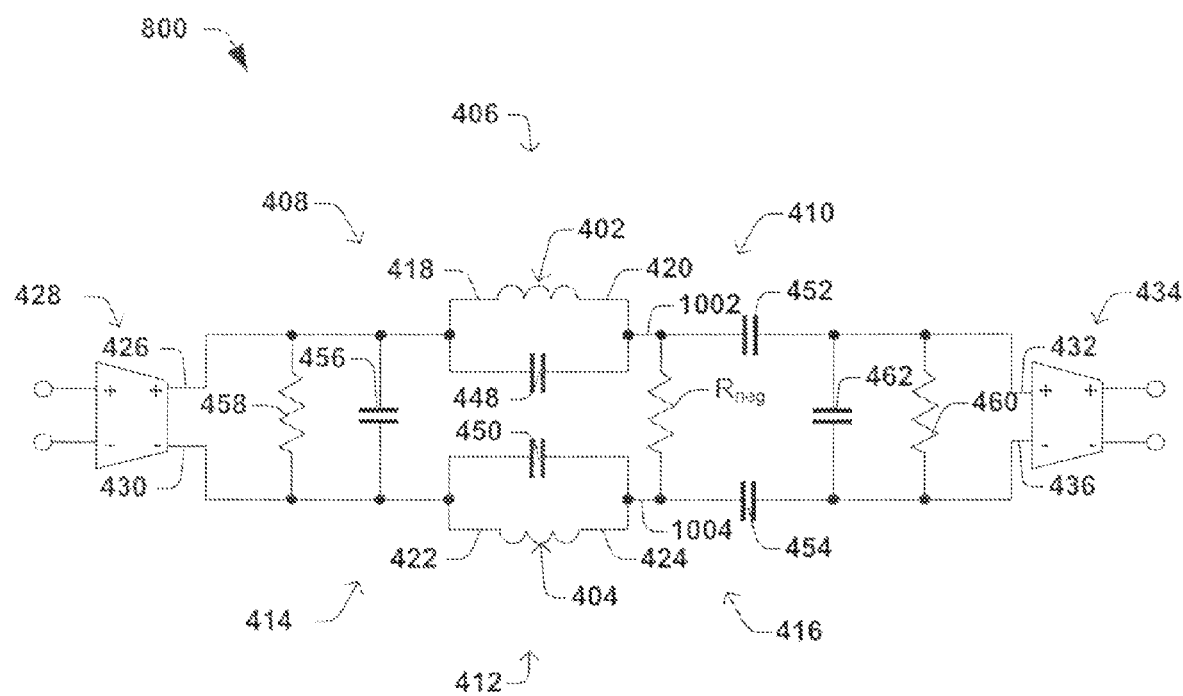
FIG. 10 is a schematic of one embodiment of an adjustable differential band-pass filter that employs a negative resistance.

Referring now to FIG. 10, one can see that additional aspects of the invention relate to methods and circuits for efficiently compensating for inductor losses. This can be accomplished by connecting a negative resistance $R_{neg}$ between the output portion 410 of the first leg 406 and the output portion 416 of the second leg 412 as shown. More specifically, in FIG. 10's embodiment, the negative resistance $R_{neg}$ is coupled between a first node 1002 (between the first inductor 402 and third capacitor 452) and a second node 1004 (between the second inductor 404 and the fourth capacitor 454).

Figure 11:
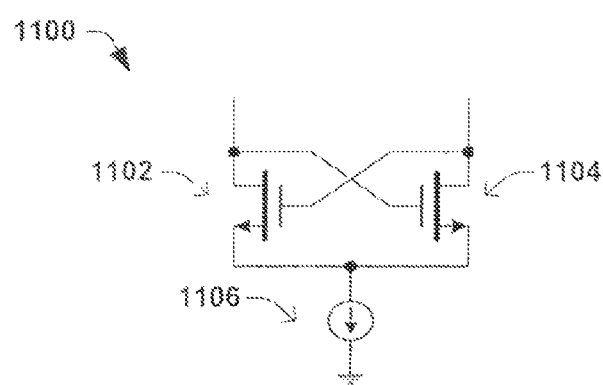
FIG. 11 is a schematic of one embodiment of a circuit for providing a negative resistance.

The negative resistance $R_{neg}$ can efficiently compensate for the losses caused by the first and second inductors 402, 404. As can be seen in FIG. 11, the negative resistance $R_{neg}$ may include a first NMOS transistor 1102 with a drain that is coupled to the second node 1004, and a second NMOS transistor 1104 with a drain that is coupled to the first node 1002. The negative resistance acts as the equivalent resistance between the drains of the first and second NMOS transistors 1102, 1104, which are fully identical in geometrical sizes, length-to-width ratio, doping profiles, etc. The first and second NMOS transistors 1102, 1104 form a differential pair meaning that their sources are connected together and connected to ground via current mirror 1106. The current mirror acts as a dc current source and determines the dc currents through the transistors. By changing the current of the current mirror, the equivalent negative resistance of the circuit is tuned. In various un-illustrated embodiments, the drains of the NMOS transistors 1102, 1104 could be tied to a positive terminal of the supply voltage by other current mirrors or other circuits having high dynamic (ac) resistance. The connection to the supply voltage of the first and second NMOS transistors could also be achieved by diverting part of the dc currents in the output stages of the operational transconductance amplifier 428 in FIG. 10. Thus, the negative resistance $R_{neg}$ is connected symmetrically concerning the ground, which avoids imbalance between the first and second legs 406, 412 of the differential passband filter 800.

Figure 12:
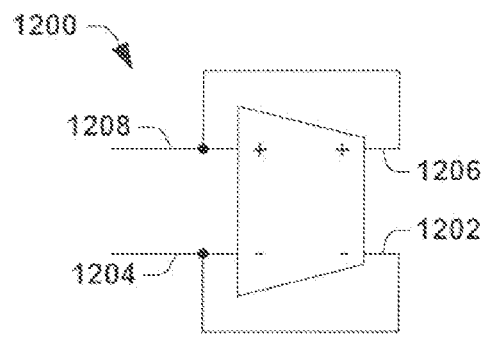
FIG. 12 is a schematic of another embodiment of a circuit for providing a negative resistance.

The negative resistance can also be created by cross-coupled differential pairs of PMOS transistors or by cross-coupled differential pairs of bipolar transistors. FIG. 12 shows still another embodiment of an operational transconductance amplifier 1200 with its inverting output 1202 tied to its inverting input 1204 and its non-inverting output 1206 tied to its noninverting input 1208. This operational transconductance amplifier 1200 could also be used to achieve a negative resistance because it has an equivalent negative input resistance equal to the inverted transconductance of the amplifier.

For purposes of understanding, an illustrative analysis of a single-ended version of a bandpass filter 1300 having a negative resistance $R_{neg}$ is now discussed with reference to FIG. 13. While a single-ended bandpass filter has been chosen for the sake of simplicity, this analysis can be transferred to the differential bandpass filters previously discussed, since both circuits—single-ended and differential—are substantially equivalent.

Figure 13:
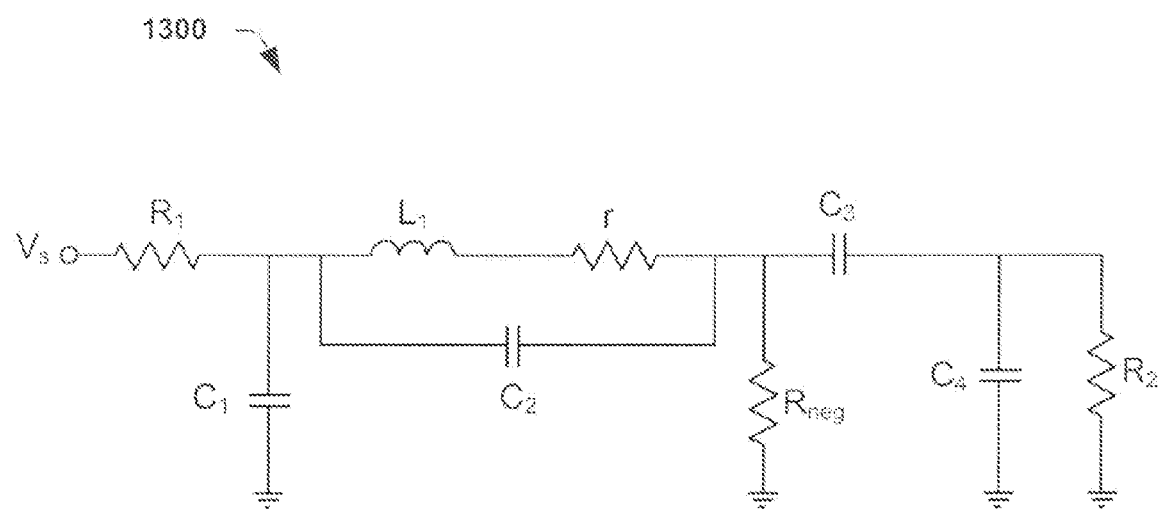
FIG. 13 is a schematic for a single-ended implementation of a band-pass filter.

The voltage transfer function of the circuit in FIG. 13 is $$T_V(s) = \frac{V_{out}}{V_s} = \frac{N_0(s) + rN_r(s)}{D_0(s) + rD_r(s) + G_{neg}D_G(s) + rG_{neg}D_{rG}(s)}. \quad (1)$$

The polynomials in (1) are:

$N_0(s)$—the initial numerator of the transfer function used in filter design.

$N_r(s)$—polynomial reflecting the influence of the loss resistance r on the numerator of the transfer function.

$D_0(s)$—the initial denominator of the filter used in filter design.

$D_r(s)$—polynomial reflecting the influence of the loss resistance r on the denominator of the transfer function.

$D_G(s)$ and $D_{rG}(s)$—polynomials reflecting the influence of the negative resistance on the denominator of the transfer function.

The loss resistance in (1) can be calculated by the formula $$r = \frac{2\pi f_0 L_1}{Q}, \quad (2)$$

where $f_0$ is the central frequency of the passband and Q is the Q-factor of the inductor at the same frequency. $G_{neg}$ is the reciprocal value of the negative resistance $$G_{neg} = \frac{1}{R_{neg}}. \quad (3)$$

The above polynomials can be represented by the element values $$N_r(s) = s^2 \frac{1}{L_1}; \quad (4)$$

$$D_r(s) = \frac{1}{h} \left\{ \begin{array}{l} s^3[C_1C_4(C_2+C_3) + C_2C_3(C_1+C_4)] + \\ s^2\left[\begin{array}{l}(C_2+C_3)(C_4G_1+C_1G_2)\\+C_2C_3(G_1+G_2)\end{array}\right] + \\ s(C_2+C_3)G_1G_2 \end{array} \right\}; \quad (5)$$

$$D_G(s) = \frac{1}{h} \left\{ \begin{array}{l} s^3L_1(C_1+C_2)(C_3+C_4) + \\ s^2L_1[G_1(C_3+C_4) + G_2(C_1+C_2)] + \\ s(L_1G_1G_2 + C_3 + C_4) + G_2 \end{array} \right\}; \quad (6)$$

$$D_{rG}(s) = \frac{1}{h} \left\{ \begin{array}{l} s^2(C_1+C_2)(C_3+C_4) + \\ s[G_1(C_3+C_4) + G_2(C_1+C_2)] + G_1G_2 \end{array} \right\}; \quad (7)$$

In the above formulas $$G_1 = \frac{1}{R_1}; \quad G_2 = \frac{1}{R_2}; \tag{8}$$

$$h = R_1 \left[ C_1 + C_4 + \frac{C_1 C_4 (C_2 + C_3)}{C_2 C_3} \right]. \tag{9}$$

The polynomials $N_0(s)$ and $D_0(s)$ are known from the filter design (from the approximation of the transfer function). The equations (4)-(7) are written under the assumption that $N_0(s)$ and $D_0(s)$ are represented in the following general way:

$$N_0(s) = s^3 + a_1 s \tag{10}$$

$$D_0(s) = h(s^4 + b_3 s^3 + b_2 s^2 + b_1 s + b_0). \tag{11}$$

The steps for determining of the value of the negative resistor $R_{neg}$ are:
1) Let $p_{10}$ is one of the complex conjugated roots of $D_0(s)$. This root is known from the design of the filter. It can be found also from $D_0(s)$ by using of some root finding program.
2) Computing the roots of the polynomial $D_0(s) + rD_r(s)$. Let $p_{1r}$ is the root corresponding to the root $p_{10}$ of $D_0(s)$. The root $p_{1r}$ can be considered as displacement of $p_{10}$ due to the inductor loss.
3) Adding of the negative resistor $R_{neg}$ to the circuit causes a new displacement $\Delta p_1$ of the considered pole. The new position of the pole is marked by $p_1$ and the displacement between $p_1$ and $p_{10}$ is $$\Delta p_1 = G_{neg} \frac{dp_1}{dG_{neg}} \tag{12}$$

The derivative in (12) is $$\frac{dp_1}{dG_{neg}} = \left. \frac{D_G(s) + rD_{rG}(s)}{\frac{dD_0(s)}{ds} + r\frac{dD_r(s)}{ds}} \right|_{s=p_{r1}}. \tag{13}$$

The goal of the compensation is to restore the initial position of the pole of the transfer function, i.e. to make $p_1 = p_{10}$. It is impossible to satisfy fully this requirement, because the roots are complex. The requirement includes two equations in fact, whereas the unknown is one—$G_{neg}$. The requirement can be satisfied partly by minimizing the distance between the initial pole $p_{10}$ and its compensated position $p_1$. This condition can be written mathematically in the following way $$|p_1 - p_{10}| = \min. \tag{14}$$

Parameter in this condition is the negative conductance $G_{neg}$. The solution of (14) is $$R_{neg} = \frac{1}{G_{neg}} = \frac{\left|\frac{dp_1}{dG_{neg}}\right|^2}{\mathrm{Re}\left\{(p_{1r} - p_{10})\left(\frac{dp_1}{dG_{neg}}\right)^*\right\}}, \tag{15}$$

where $\mathrm{Re}\{.\}$ means the real part of the expression in the curly brackets and the asterisk means the complex-conjugated value.

The value of the negative resistance does not change, when the single-ended circuit in FIG. 13 is transformed to the differential passband filters previously discussed.

Numerical examples show that the above steps give a good accuracy and the pole is restored closely to its initial position. The distance between the attenuation passband gain and the gain at the transmission zero can be increased by more than 10 dB.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A dynamically adjustable differential band-pass filter, comprising:
   a first leg of the differential band-pass filter, the first leg having an input portion and an output portion with a first inductor therebetween; and
   a second leg of the differential band-pass filter running parallel to the first leg, the second leg having an input portion and an output portion with a second inductor therebetween, the second inductor symmetrically interwoven with the first inductor,
   where the first and second inductors are spiral inductors that have matched inductances, and
   wherein the differential band-pass filter is formed in a single integrated circuit.

2. The band-pass filter of claim 1, further comprising:
   a resistor having a negative resistance that couples the output portions of the first and second legs.

3. A dynamically adjustable differential band-pass filter, comprising:
   a first leg of the differential band-pass filter, the first leg having an input portion and an output portion with a first inductor therebetween;
   a second leg of the differential band-pass filter running parallel to the first leg, the second leg having an input portion and an output portion with a second inductor therebetween, the second inductor symmetrically interwoven with the first inductor; and
   a negative resistance that couples the output portions of the first and second legs, wherein the negative resistance comprises a pair of cross-coupled transistors.

4. The band-pass filter of claim 1, where the first spiral inductor includes a number of windings and the second spiral inductor includes a number of windings, and where the windings of the first spiral inductor cross the windings of the second spiral inductor in a substantially symmetrical manner.

5. The band-pass filter of claim 1, where the first spiral inductor includes a winding segment that runs between two concentrically adjacent winding segments of the second spiral inductor.

6. The band-pass filter of claim 1, further comprising:
along the first leg, a first capacitor in parallel with the first inductor;
along the second leg, a second capacitor in parallel with the second inductor.

7. The band-pass filter of claim 6, where the first and second capacitors are configured to have adjustable capacitances that can be adjusted to tune a frequency corresponding to a maximum gain of the differential band-pass filter.

8. The band-pass filter of claim 6, further comprising:
along the first leg, a third capacitor in series with the first inductor and the first capacitor;
along the second leg, a fourth capacitor in series with the second inductor and the second capacitor.

9. The band-pass filter of claim 8, where the third and fourth capacitors are configured to have adjustable capacitances that can be adjusted to tune a frequency of a transmission zero of the band-pass filter.

10. The band-pass filter of claim 6, further comprising:
a third capacitor in series with first inductor; and
a fourth capacitor in series with second inductor.

11. The band-pass filter of claim 1, further comprising:
a first resistor and a fifth capacitor that couple the input portions of the first and second legs; and
a second resistor and a sixth capacitor that couple the output portions of the first and second legs.

12. The band-pass filter of claim 11, where the first and second resistors are configured to have adjustable resistances, and the fifth and sixth capacitors are configured to have adjustable capacitances, thereby allowing adjustment of a passband bandwidth of the band-pass filter.

13. A dynamically adjustable differential band-pass filter, comprising:
a first leg of the differential band-pass filter, the first leg having an input portion and an output portion with a first inductor therebetween;
a second leg of the differential band-pass filter running parallel to the first leg, the second leg having an input portion and an output portion with a second inductor therebetween, the second inductor symmetrically interwoven with the first inductor
a first amplifier having differential inputs and differential outputs, where a first differential output of the first amplifier is coupled to the input portion of the first leg and a second differential output of the first amplifier is coupled to the input portion of the second leg; and
a second amplifier having differential inputs and differential outputs, where a first differential input of the second amplifier is coupled to the output portion of the first leg and a second differential input of the second amplifier is coupled to the output portion of the second leg.

14. The band-pass filter of claim 13, where the first amplifier is an operational transconductance amplifier that is configured to have adjustable transconductance and the second amplifier is a differential amplifier configured to have adjustable gain that can be adjusted to tune a gain of the band-pass filter.

15. A method of tuning a differential band-pass filter, comprising:
adjusting a frequency of a transmission zero of the differential band-pass filter by simultaneously adjusting capacitances of a first pair of capacitors;
adjusting a frequency of maximum gain of the differential band-pass filter by simultaneously adjusting capacitances of a second pair of capacitors;
adjusting a width of a pass-band of the differential band-pass filter by simultaneously adjusting capacitances of a third pair of capacitors and simultaneously adjusting resistances of a first pair of resistors; and
adjusting a filter gain of the differential band-pass filter by adjusting transconductances of a pair of operational transconductance amplifiers.

16. The method of claim 15, further comprising:
compensating for inductor losses by utilizing a negative resistance coupled between differential legs of the differential band-pass filter.

17. The dynamically adjustable differential band-pass filter of claim 13, further comprising:
a resistor having a negative resistance that couples the output portions of the first and second legs.

* * * * *